United States Patent
Pinckley et al.

[11] Patent Number: 5,854,571
[45] Date of Patent: Dec. 29, 1998

[54] METHOD AND APPARATUS FOR CONTROLLING A PEAK ENVELOPE POWER OF A POWER AMPLIFIER

[75] Inventors: Danny Thomas Pinckley, Arlington; Kevin Michayl Laird, Haltorn; Charles N. Lynk, Jr., Bedford, all of Tex.

[73] Assignee: Motorola Inc., Schaumburg, IL, Del.

[21] Appl. No.: 144,931

[22] Filed: Oct. 28, 1993

[51] Int. Cl.[6] ............................................... H03G 3/20
[52] U.S. Cl. ........................ 330/129; 330/124 R; 455/105
[58] Field of Search ........................... 330/107, 124 R, 330/129, 132; 455/103, 105, 115, 126

[56] References Cited

U.S. PATENT DOCUMENTS

| | | | |
|---|---|---|---|
| 4,718,111 | 1/1988 | Jongsma | 455/105 |
| 4,794,343 | 12/1988 | Yang | 330/129 X |
| 5,302,914 | 4/1994 | Arntz et al. | 330/124 R |

*Primary Examiner*—Steven Mottola
*Attorney, Agent, or Firm*—Richard A. Sonnentag

[57] ABSTRACT

An apparatus and method of reducing a peak envelope power of a linear power amplifier (10) amplifying a plurality of channels is provided. The method includes the steps of measuring (104) the peak envelope power of the linear power amplifier, measuring a channel activity level (101) of each channel of the plurality of channels, and, when the peak envelope power exceeds a first threshold, changing (103, 106) at least one parameter of a channel of the plurality of channels having a channel activity level exceeding a second threshold to reduce the peak envelope power.

11 Claims, 5 Drawing Sheets

METHOD AND APPARATUS FOR
CONTROLLING A PEAK ENVELOPE
POWER OF A POWER AMPLIFIER

FIELD OF THE INVENTION

The field of the invention relates to power amplifiers (PAs) and in particular to a method and apparatus for controlling a peak envelope power of the PA.

BACKGROUND OF THE INVENTION

Cellular systems simultaneously handling a number of traffic channels through each base station are known. Such systems are typically assigned a number of channels ($f_1$–$f_n$) in support of communications with mobile communication units through such local base stations. Each base station is, in turn, allotted a subset of the channels ($f_1$–$f_n$). Of the subset of channels assigned to a base site at least one (and often more) is designated as a control channel for purposes of access control and channel set-up.

Communication with a communication unit on a traffic channel within a service coverage area of the base site is often accomplished through an omnidirectional antenna centrally located within the service coverage area. A number of communications transactions may be simultaneously supported through the antenna with each individual communication supported by a transmitter (located at the base site) assigned to the traffic channel. Each transmitter includes a modulated transmit signal source within the transceiver and a radio frequency (RF) power amplifier. Each transmitter thereby provides signal generation, modulation and amplification.

The simultaneous transmission of a number of traffic channel signals from the central antenna requires that the transmitter output of each active transceiver be combined before application to, and transmission from, the central antenna. In order to avoid interference-producing intermodulation products, signals must be combined after any non-linear steps within the amplification process. In addition, the combining topology must provide sufficient reverse isolation to insure that signals of parallel amplification branches will not be coupled into the output of other power amplifiers, again producing intermodulation products.

Where each transceiver is equipped with its own power amplifier (PA), combining must occur after the PA where signal levels, as well as combining losses, are high. A cavity combiner, for combining such high level RF signals while providing the necessary isolation, is provided by U.S. Pat. No. 4,667,172 assigned to the assignee of the present invention.

In other communication systems, transceivers are not equipped with individual PAs; instead, a common, multitone linear PA (LPA) is used for amplification after the RF signals have been combined at relatively low power levels at the outputs of the transceivers. The use of such common LPA for traffic channels in systems using a common antenna has resulted in considerable simplification of system topology, especially when both analog and digital modulation systems are combined at one site.

The use of an LPA, on the other hand, has certain disadvantages particularly where RF signals are placed on evenly spaced channel frequencies and phase locked to a common frequency source. In such a case, amplitude fluctuations resulting in signal clipping may occur where a peak envelope power of the composite signal exceeds the LPA's power peak power capability.

FIG. 1 demonstrates the effects of signal phasing in a simplified case involving three signals, A, B, and C, during a time period T. The three signals are shown in FIGS. 1-1, 1-2, and 1-3 respectively. The envelope of the summed composite signal (absolute value of A+B+C) is shown in FIG. 1-4. As may be observed, an envelope peak occurs during the middle of the period (T/2), when all three signals add constructively. The magnitude of this peak can be reduced by reversing the phase of signal C (taking the absolute value of A+B−C), as shown in FIG. 1-5.

Clipping may occur in an LPA when the peak envelope power of the composite input signal (squared envelope magnitude), multiplied by the gain of the LPA, exceeds the peak output power capability of the LPA. Peaks resulting from phase alignment have been observed to last for periods of from one to ten seconds, or longer in some systems. Clipping of the RF signal results in the generation of intermodulation products on other RF channels and degradation of system performance.

Clipping due to summation of in phase signals is most severe when the carriers of such signals are unmodulated (during speech pauses) or weakly modulated (during low energy portions of the speech waveform). Full modulation of the carriers produces random variations in the carrier phases which limits the duration of any clipping to time periods on the order of one millisecond. Where the carriers are unmodulated or weakly modulated, however, a repetitive clipping process may occur which is periodic at a rate equal to a frequency difference of contributing carriers. This repetitive clipping process is what gives rise to the generation of strong intermodulation products when the carriers are close in phase.

Past efforts to control peak envelope power due to phase summations have included de-rating of LPAs or intentionally de-correlating frequency references. De-rating accommodates phase peaks by requiring an inordinately large LPA. De-correlating frequency references improves the situation in that where peaks do occur the peaks are very short and, consequently, more easily tolerated.

The use of de-correlated (independent) frequency references is expensive and inefficient. The use of an inordinately large LPAs reduces the benefits inherent in signal combining at low power levels. A need exists for a more efficient method of peak envelope power control within a LPA.

BRIEF DESCRIPTION OF THE DRAWINGS

FIG. 2 comprises a simplified block diagram of a transmitter section of a cellular base station in accordance with an embodiment of the invention.

FIG. 3 comprises a block diagram of a phase controller in accordance with an embodiment of the invention.

FIG. 4 comprises a flow chart of peak envelope power control in accordance with an embodiment of the invention.

FIG. 5 comprises a block diagram of a transmitter section in accordance with an embodiment of the invention.

DETAILED DESCRIPTION OF THE PREFERRED EMBODIMENT

The solution to the problem of controlling peak envelope power (PEP) of a LPA lies, conceptually, in the introduction of parameter changes to signals of selected, unmodulated or lightly modulated channels, either randomly or under the control of a pre-established parameter change plan. The parameter changes are introduced one carrier at a time followed by a PEP measurement at either the input or output of the linear power amplifier. Where a parameter change increases PEP over the previous PEP power measurement the previous parameter is reversed. Where a current PEP is less than the previous measurement the parameter change is allowed to remain and the next carrier selected for parameter change.

The control of PEP through parametric control of unmodulated or lightly modulated channels provides the benefit of limiting changes to the channels which can cause controllable improvements to PEP. Limitation of parametric changes to unmodulated or lightly modulated channels allows for attenuation of signal levels of the unmodulated or lightly modulated channels without significant loss of signal information and with the beneficial effect of attenuating the subsequent pops and clicks associated with changes to carrier phasing.

An absolute value of the PEP is taken as an indication of the need for PEP control. Where the PEP exceeds a threshold, parametric changes continue one carrier at a time until the PEP is reduced to a point below the threshold. When the PEP again exceeds the threshold, the process is resumed.

The parameter change may be a phase change or a power control change. The parameter change is performed only with unmodulated or lightly modulated channels. The determination of modulation level is determined by measurement of a channel activity level. If the channel activity level exceeds a theshold, indicating an unmodulated or lightly modulated channel, then parametric changes are made to such channels for purposes of controlling PEP.

Figure 1:
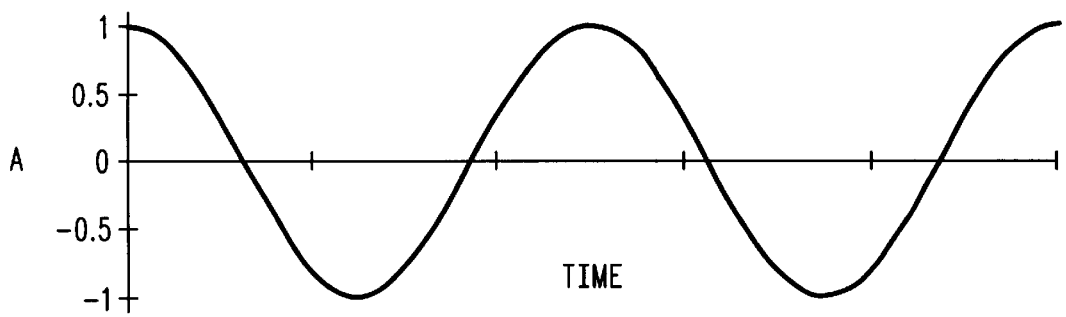
FIGS. 1-1, 1-2, 1-3, 1-4 and 1-5 depict phase summation resulting in peak envelope power peaks in a power amplifier.
Figures 1, 2:
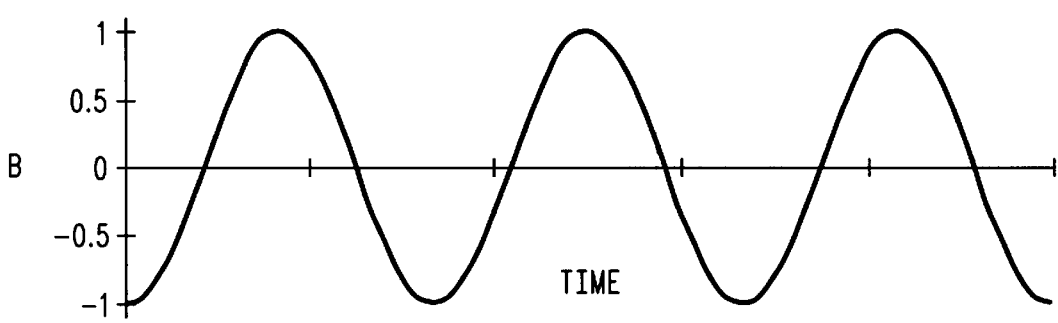
Figures 1, 2, 3:
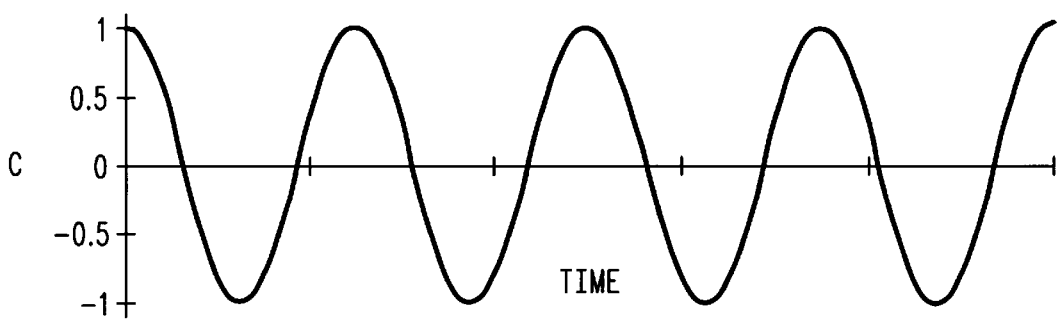
Figures 1, 2, 3, 4:
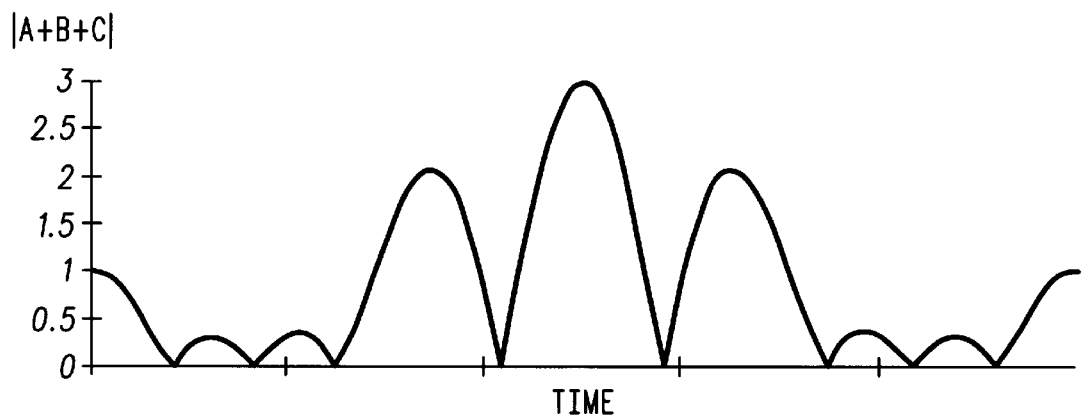

FIG. 4 is a flow chart of the process of PEP control in accordance with an embodiment of the invention. Reference will be made to FIG. 4 as appropriate in understanding the process of the invention.

For ease of presentation a discussion of the invention will first focus on PEP reduction based upon control of the parameter of carrier phasing. It is to be understood that the process of PEP control based upon additional parameters such as power control of individual carriers is an equally valid method of PEP control. Following the presentation of PEP control based upon phase changes, the discussion will be broadened to include amplitude control of transmitted signals on channels in an unmodulated or lightly modulated state.

FIG. 2 is a block diagram of a transmitter section 10 of a cellular power amplifier of a cellular base station in accordance with the invention. Control information intended for a radiotelephone (not shown) is composed within a controller 11, modulated to a carrier frequency within a controller transmitter 12, combined with other signals within a transmit combiner 15, amplified within the LPA 17, and transmitted through an antenna 18. Traffic information, likewise, received by the controller 11, is modulated within traffic transmitters 13–14, combined in the transmit combiner 15, amplified 17, and transmitted through the antenna 18.

Traffic channel information originating from within a public switch telephone network (PSTN) or another base site (not shown) is routed to appropriate traffic transmitters 13–14 by controller 11. Control information originating within controller 11 is also routed to control transmitter 12 by controller 11. The low-level output signals of transmitters 12–14 are combined within combiner 15 through resistive or other combining techniques for subsequent amplification within the LPA 17. Within LPA 17 the combined signals are amplified to a level sufficient for transmission through the antenna 18.

Combiner 15 PEP output levels are monitored by the controller 11 through the PEP detector 16. PEP levels measured 104 by the PEP detector 16 are compared with a threshold value 105 stored within the controller 11 for a determination of the need for PEP control. Upon determination for a need for PEP control the controller sequentially introduces phase changes into unmodulated or lightly modulated carriers, one at a time, until the PEP falls below the threshold.

The controller 11 introduces phase changes into individual radio frequency signals produced within the transmitter section 10 through a phase control device located within each of the transmitters 12–14 or their corresponding signal paths in combiner 15. One example of such a phase control device 30 is shown in FIG. 3. This phase control device 30 is comprised of a control 23, relay devices 24–25, and a one half wavelength conductor 22. The control 23, upon receiving the appropriate command from the controller 11, causes relay devices 24–25 to switch between two states. In the first state the relay devices remain in the quiescent state (shown in FIG. 3) in which the half wavelength conductor 22 is not included within the RF circuit. In the second state, the controller 11 energizes the relay devices 24–25 through control 23, thereby inserting the half wavelength conductor 22 into the RF path. Coupling the half wavelength conductor 22 in the signal path introduces a phase change into a carrier signal equal to a value of $\pi$.

It is to be understood that the phase control device 30 of FIG. 3 is not the only type of phase shifter that could be used in this invention. One possible variant is a phase controller having more than two states, such as one that can produce phase shifts of $\pi/2$, $\pi$, and $3\pi/2$. This can be produced by cascading the phase control device 30 shown in FIG. 3 with a similar phase control device which contains a quarter wavelength conductor in place of the half wavelength conductor 22. Phase control could also be affected through the frequency synthesis circuits in transmitters 12–14, for example, by inserting a phase shift into the reference frequency signal driving a particular synthesizer. In fact, this is one of the best ways since the phase change can be made slowly and with high resolution.

By way of example the transmitter section 10 is operating at full capacity with an RF signal being transmitted through each of the transmitters 12–14. PEP levels of the combined channels are measured 104 by the PEP detector 16 and transferred to the controller 11. Within the controller 11 the PEP values are compared 105 with a threshold value. When the PEP is below the threshold value no action is taken relative to PEP control.

When controller 11 detects 105 that the PEP is above the threshold value, the controller 11 changes 106 the state of the phase control device 30 of a transmitter 12–14 identified within a register (carrier register) in a memory (not shown) of the controller 11. Changing the state of the phase control device 30 of one of transmitters 12–14 causes a phase change of a selected carrier passing through transmitter 12–14 identified by the register.

After changing the state of the phase control device 30 the controller takes a second PEP measurement 107 through the PEP detector 16. The second PEP measurement is compared with the first measurement. Where the second PEP value is smaller than the first PEP value the controller 11 selects 100 another carrier (e.g., by incrementing the contents of the carrier register). Where the second measurement is larger than the first, the controller 11 reverses 109 the phase change. After restoring the phase of the originally selected carrier to an original state, the controller 11 selects another carrier and the process repeats, so long as the PEP value is above the threshold.

Figures 1, 2, 3, 4, 5:
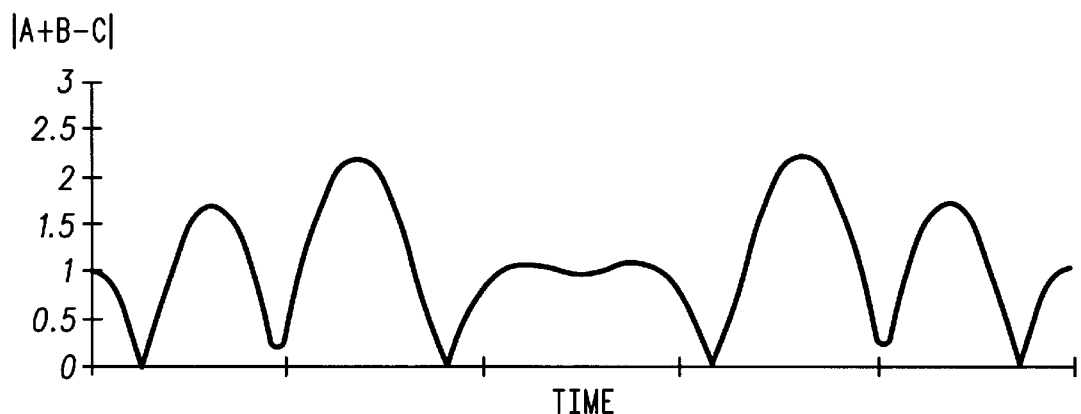
Figure 2:
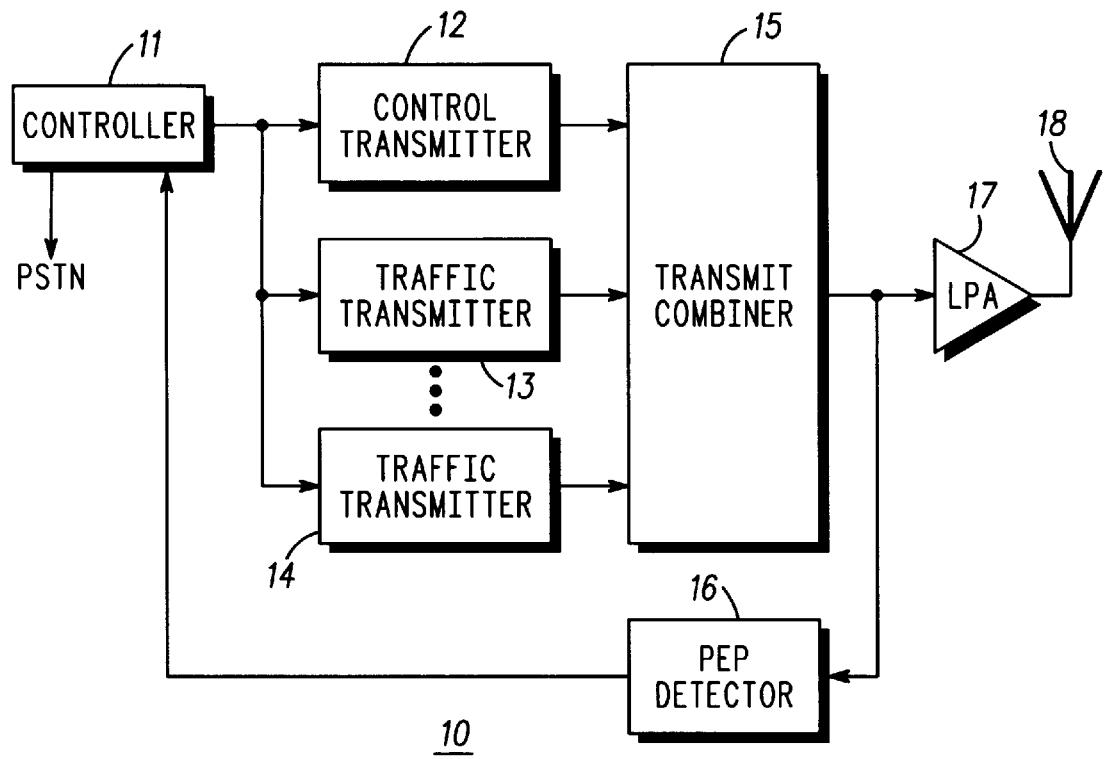
Figure 3:
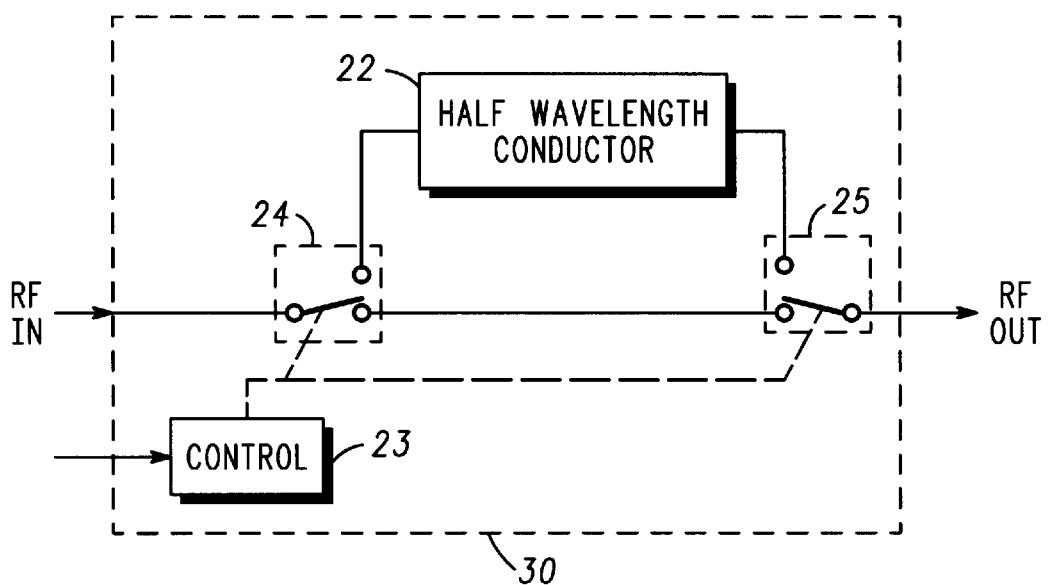
Figure 4:
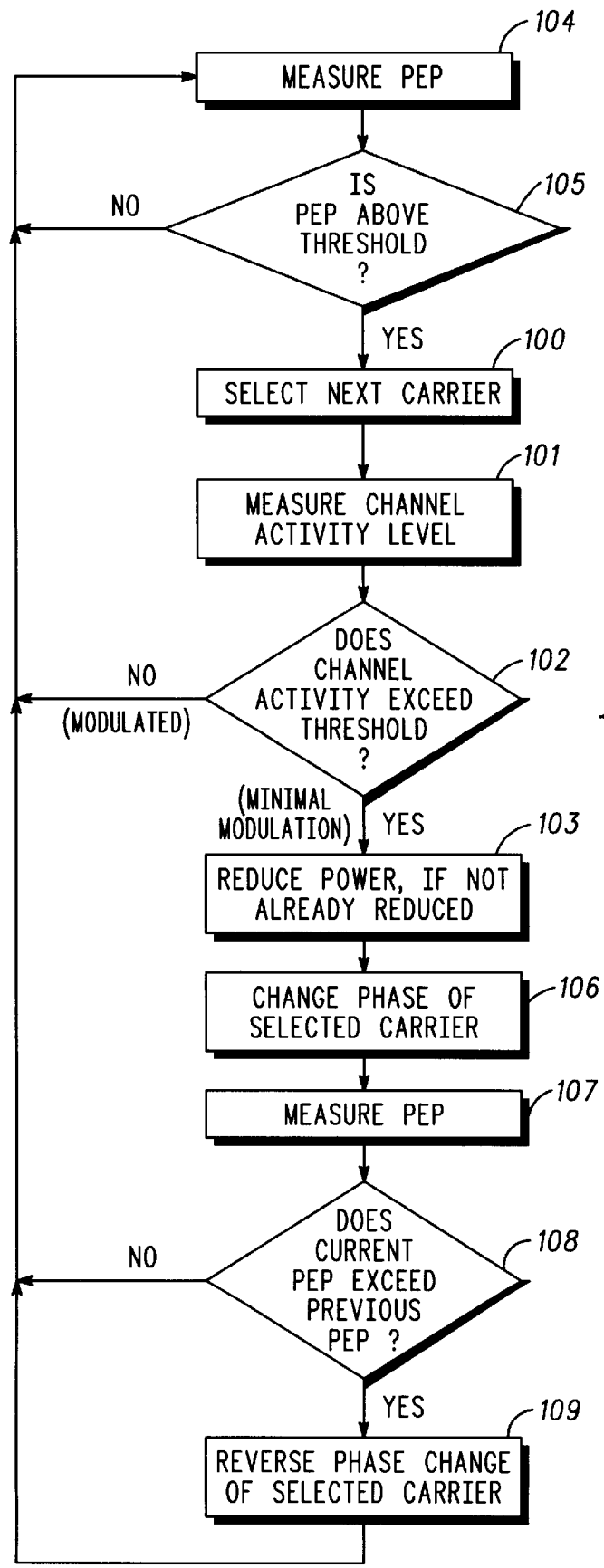
Figure 5:
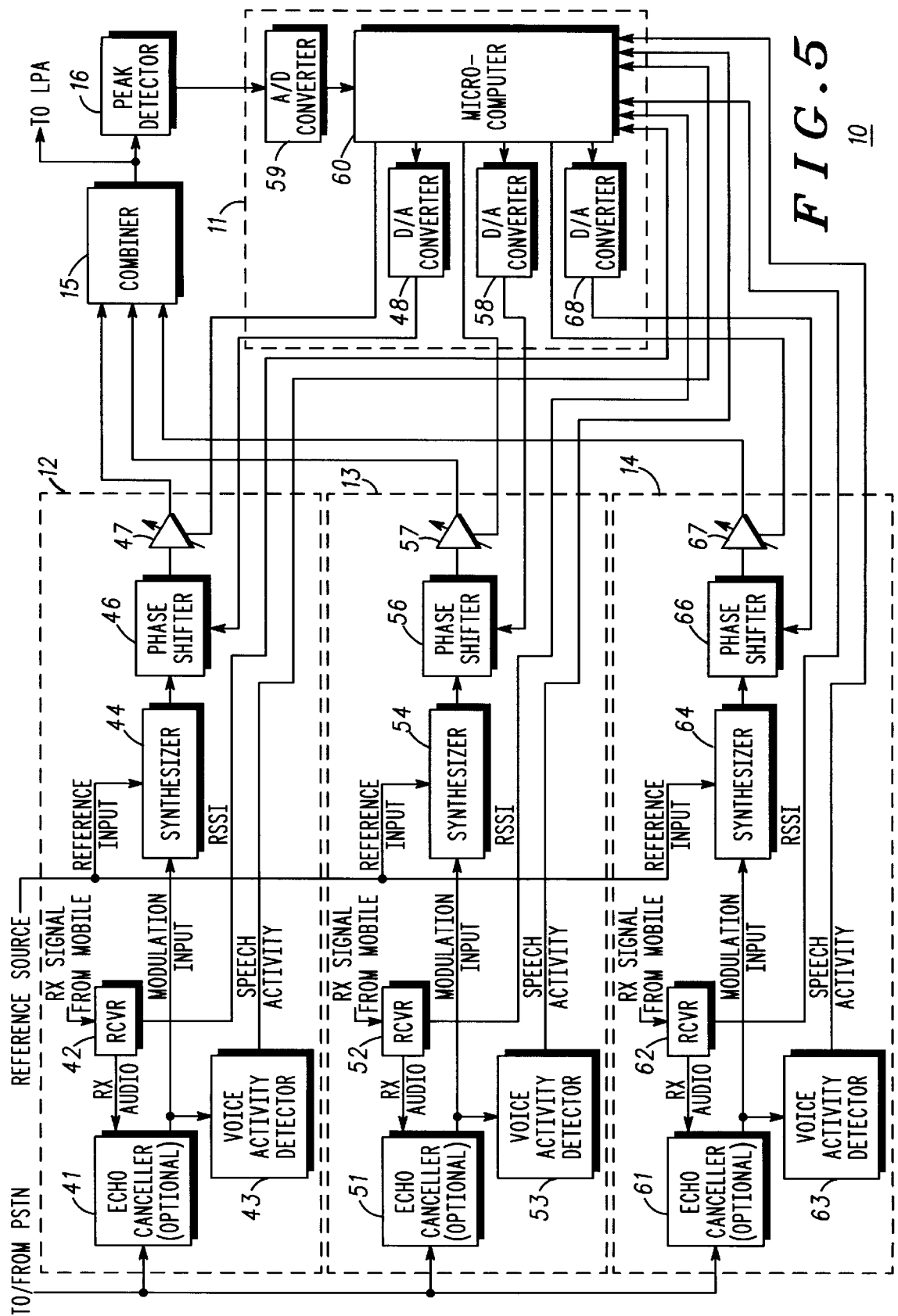

FIG. 5 is a more detailed block diagram of the transmitter section 10 of FIG. 2, providing a more detailed view of the PEP controller system and allowing for control of PEP using power control, in accordance with an embodiment of the invention. The PEP controller system of the transmitter section 10 is shown with provisions for controlling the PEP of three channels 12–14. The interconnect with the PSTN in FIG. 5 is shown directly to the transmitters 12–14, it being assumed that the channel switching provided by the controller 11 of FIG. 2 is being handled elswhere in FIG. 5.

In accordance with an embodiment of the invention, an echo canceller 41, 51, 61 is provided for each of the transmitters 12–14. The echo canceller 41, 51, 61 allows the voice activity detectors 43, 53, 63 to obtain an accurate measurement of channel activity 101. The measurement of channel activity is compared with a threshold value within each of the voice activity detectors 43, 53, and 63 for an identification of candidate channels for parametric changes to reduce PEP.

Using speech activity inputs from each voice activity detector 43, 53, 63 the microcomputer 60 identifies unmodulated or lightly modulated channels and sends a signal to each amplifier 47, 57, 67 to selectively reduce 103 the forward channel power level (base station to mobile) of each transmitter 12–14 by a predetermined power level (e.g., 3 db). (Optionally, this reduction in forward power level can be omitted if the received signal strength indicator (RSSI) level measured from the subscriber is insufficient to insure good carrier to noise performance.) Where a selected channel does not exceed the threshold, another channel is selected 100.

After determining that the channel activity exceeds the threshold a PEP measurement is performed by a PEP detector 16. The PEP value measured by the PEP detector 16 is converted into the proper format within an analog to digital (A/D) converter 59 and compared with a threshold within a micro-computer 60. If the PEP does not exceed the threshold the measuring process repeats until a need arises for PEP control.

Where the PEP exceeds the threshold the micro-computer 60 transmits a phase change command through an appropriate digital to analog (D/A) converter to the appropriate phase shifter 46, 56, 66. Upon receipt of the phase shift command the phase shifter 46, 56, 66 introduces 106 a phase shift into the selected carrier.

Following the phase change the PEP is again measured 107. If the phase change does not reduce the PEP, then the phase change is reversed. If the phase change did reduce the PEP another carrier is selected.

Carrier selection for parametric changes may be incremental (e.g., each carrier is processed in order) or random. Where a small number of carriers is used an incremental system provides a simple, easy to implement, process. Where larger number of carriers are used a random process may be indicated.

Control of PEP through adjustment of parameters beneficially provides a method of reducing PEP without having an effect on average transmitted power during times of significant modulation. Such an effect can be demonstrated in the simple case demonstrated by the phase change in FIG. 1-5 where a phase change of $\pi$ to signal C would cause PEP to be reduced. Changing a phase of a carrier or a power level in a transmitter of a cellular system would have a much less significant effect because of larger number of carriers. The process of testing each carrier after phase changes for its effect upon PEP, on the other hand, insures that only the carriers contributing to PEP will be affected. Comparison of PEP with a threshold value ensures that parametric changes will only occur when a need exists. Comparison of a channel activity level with a threshold value ensures that only those channels having the greatest effect upon PEP (unmodulated or lightly modulated channels) are effected by parametric changes.

The many features and advantages of this invention are apparent from the detailed specification and thus it is intended by the appended claims to cover all such features and advantages of the system which fall within the true spirit and scope of the invention. Further, since numerous modifications and changes will readily occur to those skilled in the art (e.g., parametric changes of active channels), it is not desired to limit the invention to the exact construction and operation illustrated and described, and accordingly all suitable modifications and equivalents may be resorted to, falling within the scope of the invention.

It is, of course, to be understood that the present invention is, by no means, limited to the specific showing in the drawing, but also comprises any modification within the scope of the appended claims.

We claim:

1. A method of reducing a peak envelope power of a linear power amplifier amplifying a plurality of carriers of a corresponding plurality of channels, such method comprising the steps of: measuring the peak envelope power of a composite of at least two of the carriers; measuring a channel activity level of one of the at least two carriers; and, when the measured peak envelope power exceeds a first threshold, changing a parameter of one of the at least two carriers when the measured channel activity level exceeds a second threshold.

2. The method of claim 1 wherein the step of changing a parameter further comprises reducing a power level of a carrier of the channel.

3. The method of claim 1 wherein the step of changing a parameter further comprises changing a phase of a carrier of the channel.

4. An apparatus for reducing a peak envelope power of a linear power amplifier amplifying a plurality of carriers of a corresponding plurality of channels, such apparatus comprising: means for measuring the peak envelope power of a composite of at least two of the carriers; means for measuring a channel activity level of one of the at least two carriers; and means for changing a parameter of one of the at least two carriers when the measured channel activity level exceeds a second threshold and when the peak envelope power exceeds a first threshold.

5. The apparatus of claim 4 wherein the means for changing a parameter further comprises means for reducing a power level of a carrier of the channel.

6. The apparatus of claim 4 wherein the means for changing a parameter further comprises means for changing a phase of a carrier of the channel.

7. A method of reducing a peak envelope power of a linear power amplifier amplifying a plurality of carriers of a corresponding plurality of channels, such method comprising the steps of: measuring the peak envelope power of a composite of at least two of the carriers; measuring a channel activity level of each of the at least two carriers; and, when the peak envelope power exceeds a first threshold, changing a power level of a carrier having a channel activity level exceeding a second threshold to reduce the peak envelope power.

8. An apparatus for reducing a peak envelope power of a linear power amplifier amplifying a plurality of carriers of a corresponding plurality of channels, such apparatus comprising: means for measuring the peak envelope power of a composite of at least two of the carriers; means for measuring a channel activity level of each of the at least two carriers; and means for changing a power level of a carrier having a channel activity level exceeding a second threshold when the peak envelope power exceeds a first threshold to reduce the peak envelope power.

9. A method of reducing a peak envelope power of a linear power amplifier amplifying a plurality of carriers of a corresponding plurality of channels, such method comprising the steps of: measuring the peak envelope power of a composite of at least two of the carriers; measuring a channel activity level of each of the at least two carriers; and, when the peak envelope power exceeds a first threshold, changing a phase of a carrier having a channel activity level exceeding a second threshold to reduce the peak envelope power.

10. An apparatus for reducing a peak envelope power of a linear power amplifier amplifying a plurality of carriers of a corresponding plurality of channels, such apparatus comprising: means for measuring the peak envelope power of a composite of at least two of the carriers; means for measuring a channel activity level of each of the at least two carriers; and means for changing a phase of a carrier having a channel activity level exceeding a second threshold when the peak envelope power exceeds a first threshold to reduce the peak envelope power.

11. An apparatus for reducing a peak envelope power of a linear power amplifier amplifying a plurality of carriers of a corresponding plurality of channels, such apparatus comprising: a peak envelope power detector; a channel activity level detector for measuring a channel activity level of each carrier of the plurality of carriers; and a peak envelope power controller, coupled to the peak envelope power detector and the channel activity level detector, for changing a parameter of a carrier having a channel activity level exceeding a second threshold when the peak envelope power exceeds a first threshold to reduce the peak envelope power.

* * * * *